United States Patent
Kim et al.

(10) Patent No.: US 7,355,901 B2
(45) Date of Patent: Apr. 8, 2008

(54) SYNCHRONOUS OUTPUT BUFFER, SYNCHRONOUS MEMORY DEVICE AND METHOD OF TESTING ACCESS TIME

(75) Inventors: Min-Soo Kim, Seoul (KR); Chi-Wook Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/411,605

(22) Filed: Apr. 26, 2006

(65) Prior Publication Data
US 2006/0192600 A1 Aug. 31, 2006

Related U.S. Application Data

(62) Division of application No. 10/738,876, filed on Dec. 17, 2003, now Pat. No. 7,068,083.

(30) Foreign Application Priority Data
Jan. 20, 2003 (KR) .................. 03-3589

(51) Int. Cl.
G11C 7/10 (2006.01)
(52) U.S. Cl. ............... 365/189.05; 365/201; 365/233; 327/108; 327/112
(58) Field of Classification Search .......... 365/189.01, 365/189.05, 189.11, 201 X, 233 X, 201, 365/233; 327/108 X, 112 X, 108, 112
See application file for complete search history.

(56) References Cited

U.S. PATENT DOCUMENTS

| | | | |
|---|---|---|---|
| 5,552,745 A | 9/1996 | Palella et al. | 327/407 |
| 6,671,787 B2 * | 12/2003 | Kanda et al. | 711/167 |
| 2005/0116746 A1 | 6/2005 | Lee et al. | 327/108 |

* cited by examiner

*Primary Examiner*—VanThu Nguyen
(74) *Attorney, Agent, or Firm*—Mills & Onello LLP

(57) ABSTRACT

An output buffer includes an output terminal, a pull up module, a pull down module and an output latching module. The pull up module pulls up the output terminal to a first source voltage when the pull up module is active. The pull down module pulls down the output terminal to a second source voltage when the pull down module is active. The output latching module latches a data signal in response to a state of an output clock signal in a first operation mode. The output latching module latches the data signal in response to a leading edge of the output clock signal in a second operation mode. The output latching module drives the pull up module and the pull down module in response to the data signal latched by the output latching module, so that the output latching module outputs the data signal to the output terminal in a second operation mode.

4 Claims, 9 Drawing Sheets

SYNCHRONOUS OUTPUT BUFFER, SYNCHRONOUS MEMORY DEVICE AND METHOD OF TESTING ACCESS TIME

CROSS-REFERENCE TO RELATED APPLICATIONS

This application is a divisional of U.S. application Ser. No. 10/738,876, filed on Dec. 17, 2003, now U.S. Pat. No. 7,068,083 which relies for priority upon Korean Patent Application No. 10-2003-0003589, filed on Jan. 20, 2003, the contents of which are herein incorporated by reference in their entirety.

BACKGROUND OF THE INVENTION

1. Field of the Invention

The present invention relates to a synchronous output buffer, a synchronous memory device and a method of testing access time, more particularly to an output buffer of a double data rate synchronous dynamic random access memory (DDR-SDRAM), a synchronous memory device and a method of testing access time.

2. Description of the Related Art

As the multimedia industry continues to develop and as system operation speeds continue to increase, memory devices having higher speed, higher functionality and lower power consumption are needed. For this reason, several popular memory technologies, including Rambus DRAM, DDR SDRAM, PC133 standardized SDRAM, etc., are in competition for market share.

The DDR is currently the technical standard of the next generation DRAM having high operation speeds, and can be manufactured using conventional production equipment. In a DDR, the transfer rate of data is doubled so as to enhance the overall operation speed. The DDR is one of the high-speed memory device technologies that have been adopted by Joint Electronic Device Engineering Council (JEDEC), an international standardization organization, in 1997.

As the operation speed of the memory device becomes higher, improved accuracy is require in various parameters and in specification of the operation speed. One of the most important timing parameters of associated with the operation speed is address access time tAA. The address access time tAA represents the elapsed time from the clock edge to data output.

The address access time tAA parameter is represented in the following equation, $$tAA = tCK \times (CL-1) + tAC,$$

wherein tCK represents the time duration of the clock cycle, CL(CAS Latency) is a number obtained by dividing the time from the input of a read output signal to the output of effective data by the time of the clock cycle, and tAC represents access time from the front edge of the clock to the output of effective data. In this manner, precise measurement of the tAA and tAC parameters is required so as to test the performance of a memory chip device.

An AC parameter test is performed so as to test whether various AC parameters are satisfactory in accordance with a design. When an operator of the AC parameter test is not particularly skilled, incorrect test results may be induced due to the limitations of the measuring device. As a result, faulty designs or products may pass through the test as fully functional.

SUMMARY OF THE INVENTION

In one aspect of the present invention, an output buffer that is responsive to a leading edge of a clock signal is provided.

In another aspect of the present invention, a synchronous memory device that allows for easy measurement of access time is provided.

In still another aspect of the present invention, a method of testing the access time of a memory chip is provided, in a manner that reduces measurement error.

In a first aspect, the present invention is directed to an output buffer that includes an output terminal, a pull up module, a pull down module and an output latching module. The pull up module pulls up the output terminal to a first source voltage when the pull up module is turned on, or active. The pull down module pulls down the output terminal to a second source voltage lower than the first source voltage when the pull down module is turned on, or active. The output latching module latches a data signal in response to a state of an output clock signal in a first operation mode. The output latching module drives the pull up module and the pull down module in response to the data signal latched by the output latching module, so that the output latching module outputs the data signal at the output terminal in a first operation mode. The output latching module latches the data signal in response to an edge, for example a leading edge, of the output clock signal in a second operation mode. The output latching module drives the pull up module and the pull down module in response to the data signal latched by the output latching module, so that the output latching module outputs the data signal at the output terminal in the second operation mode.

In another aspect, the present invention is directed to a synchronous memory device that includes a memory cell array, a read output circuit and an output buffer. The memory cell array stores data. The read output circuit reads the data stored in the memory cell array, and outputs a data signal. The output buffer maintains an output terminal at a high impedance state in a stand-by mode. The output buffer latches the data signal in response to a state of the output clock signal so that the data signal is output at the output terminal in response to the latched data signal in a first operation mode. The output buffer latches the data signal in response to an edge, for example, a leading edge, of the output clock signal so that the output signal is output at the output terminal in response to the latched data signal in a second operation mode.

In another aspect, the present invention is directed to a method of testing an access time of a memory chip. The memory chip in set into a test mode. A read command is input to the memory chip synchronously with a clock signal at a first time. A data is read from a memory cell. The outputting of the data is controlled in response to the read command such that the output data is buffered at an output buffer that latches the data in response to a state of a clock signal so that the latched data is output in response to a latched data signal in a first operation mode, and that latches the data in response to a leading edge of the clock signal so that the latched data is output in a second operation mode. It is then determined whether the output data is valid from the first time to a predetermined time.

According to the synchronous buffer, the synchronous memory device and the method of testing access time in accordance with the present invention, efficiency of the testing of a high-speed memory device, such as DDR-SDRAM, is enhanced. That is, the output buffer is controlled such that the data is received at the leading edge of the output clock signal during a test operation. In this manner, accurate testing of the memory device is enabled, in a manner that improves the efficiency of the test, irrespective of the level of skill of the test operator.

BRIEF DESCRIPTION OF THE DRAWINGS

The above and other objects and advantages of the present invention will become readily apparent by reference to the following detailed description when considered in conjunction with the accompanying drawings, in which.

DETAILED DESCRIPTION OF PREFERRED EMBODIMENTS

Figure 1:
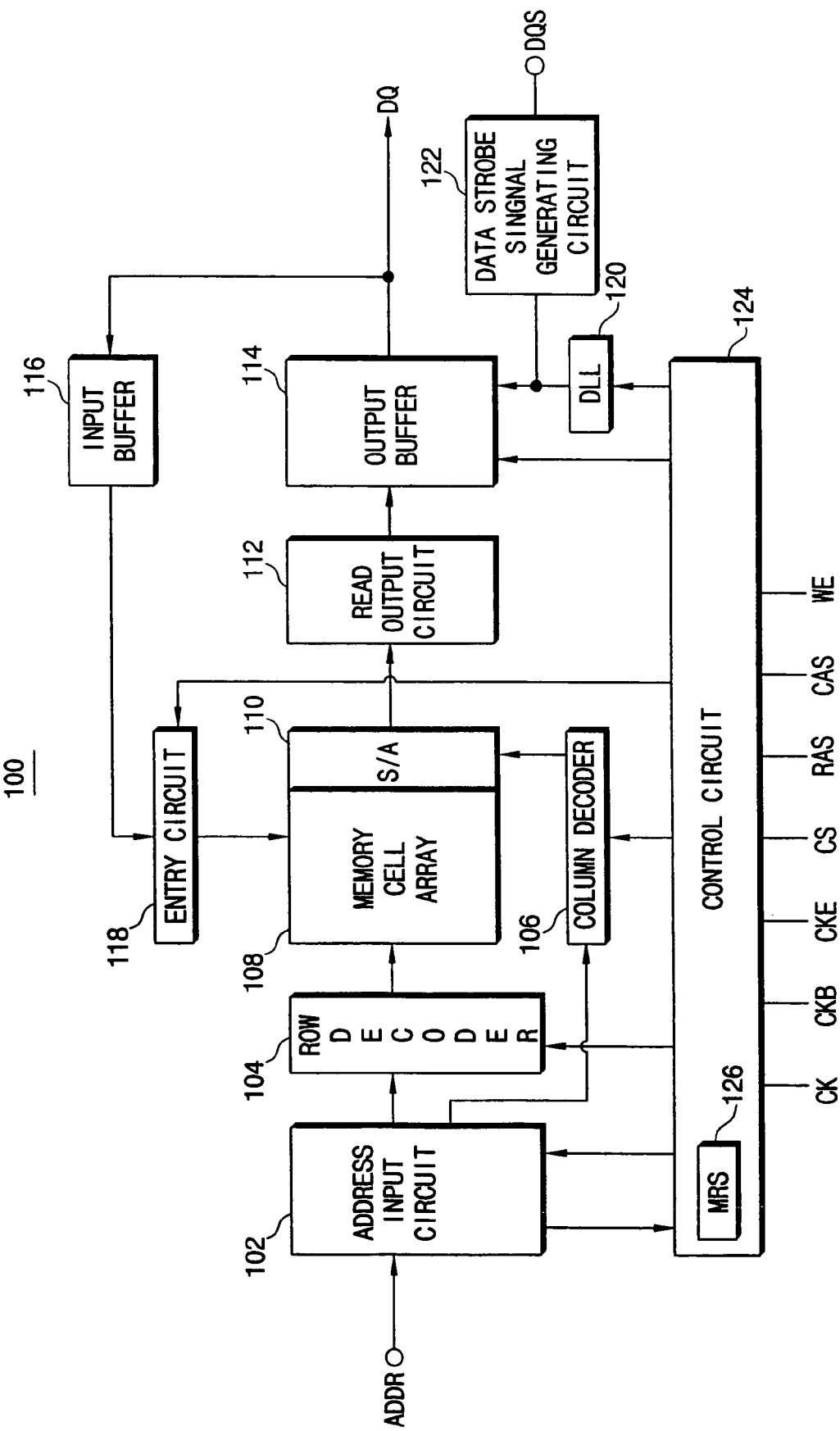
FIG. 1 is a block diagram showing a DDR SDRAM according to one embodiment of the present invention.

FIG. 1 is a block diagram showing a DDR SDRAM of the present invention.

Referring to FIG. 1, a DDR SDRAM 100 includes an address input circuit 102, a row decoder 104, a column decoder 106, a memory cell array 108, a sense amplifier 110, a multiplexing circuit (or read output circuit) 112, an output buffer 114, an input buffer 116, an entry circuit 118, a Delay Locked Loop (DLL) 120, a data strobe signal generating circuit 122 and a control signal 124. The control signal 124 has a mode register 126.

The address input circuit 102 is electrically coupled to an address terminal ADDR. An external address signal is applied to an address register of the address input circuit 102 via an address buffer, synchronously with a clock signal as a row activation command. A top bit of the address signal is a chip selection address signal Ai. A row address includes one or more bits of a memory bank address, and the remainder of the bits are used as a row address. A column address is applied to the address register synchronously with a clock signal as a read/write command. The column address applied to the address register is also applied to a mode register 126 of the control circuit 124 on the timing of a mode register cycle to set a register value.

The row decoder 104 decodes a row address applied from the address input circuit 102 to select a word line corresponding to the memory cell array 108.

The column decoder 106 decodes a column address applied from the address input circuit 102 to select a column corresponding to the memory cell array 108.

The multiplexing circuit 112 multiplexes a data signal applied from sense amplifier 110 synchronously with a clock signal, and applies the data signal to the output buffer 114.

The entry circuit 118 preserves a data signal applied by the input buffer 116, and applies the data signal to the memory cell array 108 synchronously with a clock signal.

The delay locked loop 120 receives an external clock signal CK and CKB from the control circuit 124 to generate an internal clock signal.

The data strobe signal generating circuit 122 receives the internal clock signal to generate data strobe signal DQS.

The control circuit 124 receives external clock signals CK and CKB, a clock enable signal CKE, a chip selection signal CS, a row address strobe signal RAS, a column address strobe signal CAS and a write enable signal WE. In response, the the control circuit 124 decodes a command that is a combination of the above signals to internal control signals.

The circuits above described are similar to those of a conventional DDR-SDRAM, except for the output buffer 114.

Figure 2:
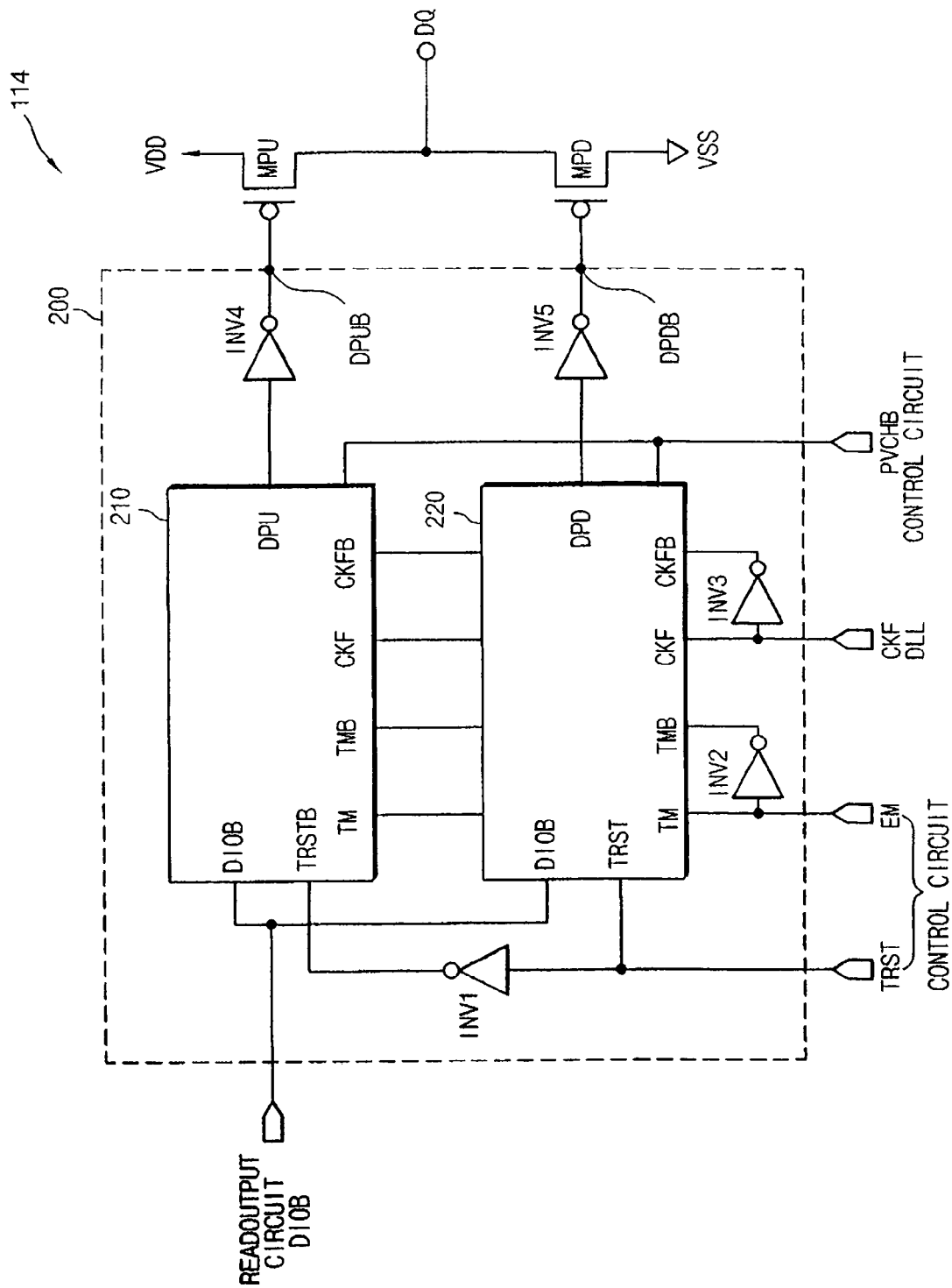
FIG. 2 is a block diagram showing an output buffer according to one embodiment of the present invention.

FIG. 2 is a block diagram showing an output buffer 114 according to one embodiment of the present invention.

Referring to FIG. 2, an output buffer 114 of the present invention includes a output latch part 200, a pull up module MPU and a pull down module MPD. The pull up module MPU includes a PMOS transistor. The pull up module MPU is turned on to pull up an output terminal DQ to a first source voltage VDD when an inversed pull up driving signal DPUB of the output latch part 200 is in a low voltage state. The pull down module MPD includes a NMOS transistor. The pull down module MPD is turned on to pull down the output terminal DQ to a second source voltage VSS when an inversed pull down driving signal DPDB of the output latch part 200 is in a high voltage state.

The output latch part 200 includes a pull up driving part 210, a pull down driving part 220, and first to fifth inverters INV1, INV2, INV3, INV4 and INV5.

The pull up driving part 210 receives a data signal DIOB, an inversed output control signal TRSTB, a test mode signal TM, an inversed test mode signal TMB, an output clock signal CKF, an inversed output clock signal CKFB and a reset signal PVCHB. The pull up driving part 210 applies the inversed pull up driving signal DPUB to the pull up module MPU via the fourth inverter INV4.

The pull down driving part 220 receives the data signal DIOB, the output control signal TRST, the test mode signal TM, the inversed test mode signal TMB, the output clock signal CKF, the inversed output clock signal CKFB and the reset signal PVCHB. The pull down driving part 220 applies the inversed pull down driving signal DPDB to the pull up module MPU through the fifth inverter INV5.

Figure 3:
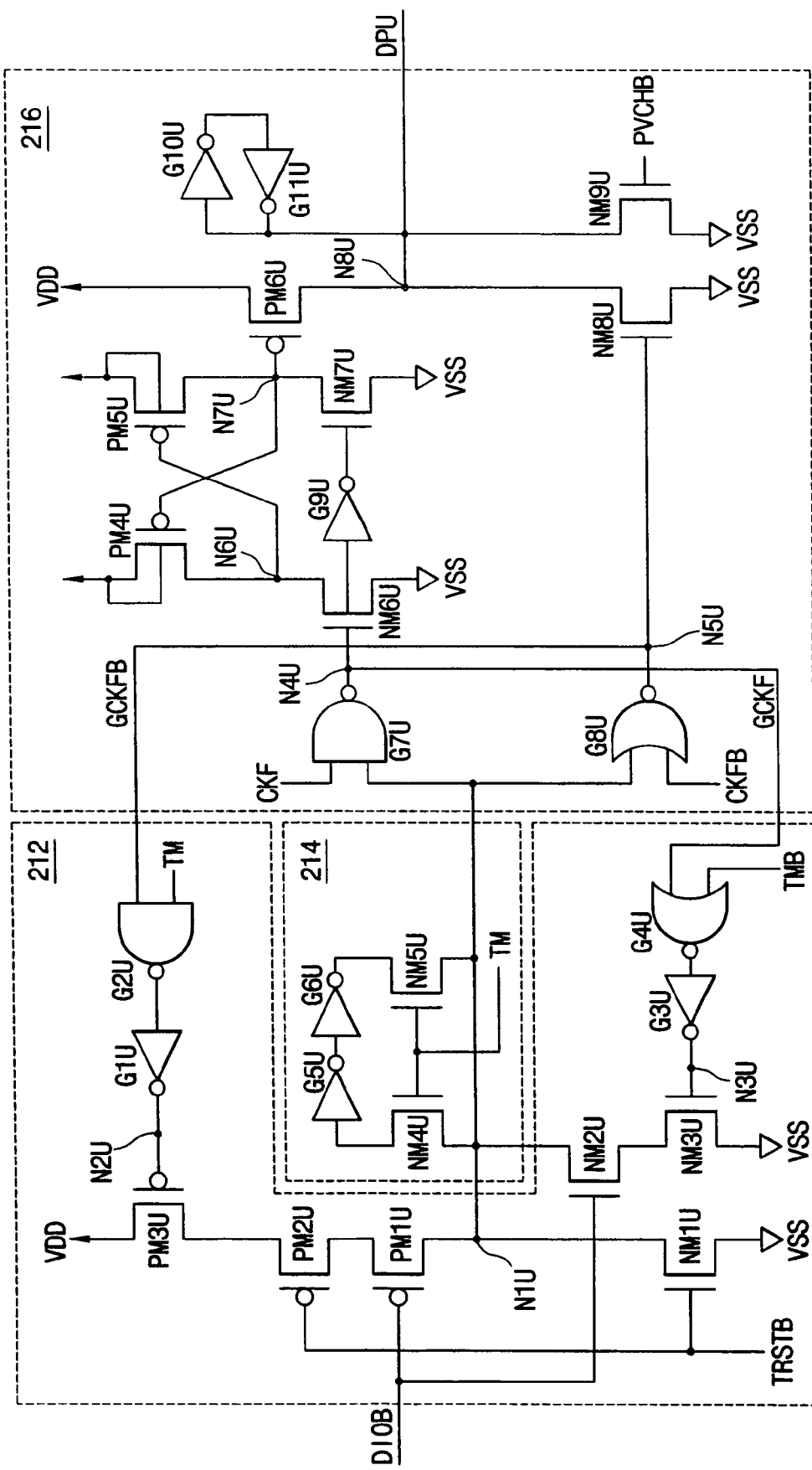
FIG. 3 is a circuit diagram showing a pull up driving part of FIG. 2.

FIG. 3 is a detailed circuit diagram showing a pull up driving part of FIG. 2.

Referring to FIG. 3, the pull up driving part 210 of FIG. 2 includes an input logic circuit 212, an input latch circuit 214 and output latch circuit 216.

The input logic circuit 212 includes a first PMOS transistor PM1U, a second PMOS transistor PM2U, a third PMOS transistor PM3U, a first NMOS transistor NM1U, a second NMOS transistor NM2U, a third NMOS transistor NM3U, a first logic gate G1U, a second logic gate G2U, a third logic gate G3U and a fourth logic gate G4U.

The first PMOS transistor PM1U has a drain electrode electrically coupled with a first node N1U, and a gate electrode for receiving a data signal DIOB. The second PMOS transistor PM2U has a drain electrode electrically coupled to a source electrode of the first PMOS transistor PM1U, and a gate electrode for receiving an inversed control output signal TRSTB. The third PMOS transistor PM3U has a drain electrode electrically coupled with a source electrode of the second PMOS transistor PM2U, a source electrode electrically coupled to a first source voltage VDD and a gate electrode electrically coupled with a second node N2U.

The first NMOS transistor NM1U has a drain electrode electrically coupled to the first node N1U, a source electrode electrically coupled to a second source voltage VSS and a gate electrode for receiving an inversed output control signal TRSTB. The second NMOS transistor NM2U has a drain electrode electrically coupled to the first node N1U, and a gate electrode for receiving the data signal DIOB. The third NMOS transistor NM3U has a drain electrode electrically coupled to a source electrode of the second NMOS transistor NM2U, a source electrode electrically coupled to the second source voltage VSS and a gate electrode electrically coupled to a third node N3U.

The first logic gate G1U has an output terminal electrically coupled with the second node N2U and an input terminal electrically coupled with an output terminal of the second logic gate G2U. A first input terminal of the second logic gate G2U is electrically coupled with a fifth node N5U and a second input terminal of the second logic gate G2U receives the test mode signal TM.

The third logic gate G3U has an output terminal electrically coupled with the third node N3U and input terminal electrically coupled with an output terminal of a fourth logic gate G4U. A first input terminal of the fourth logic gate G4U is electrically coupled with a fourth node N4U and a second input terminal of the fourth logic gate G4U receives an inversed test mode signal TMB.

In a normal operation mode, the test mode signal TM is in a low voltage state, so that the output of the second logic gate G2U becomes a high voltage state regardless of the state of the inversed gate clock signal GCKFB, and the output of the fourth logic gate G4U becomes a low voltage state regardless of the state of the gate clock signal GCKF. Therefore, the second node N2U is in low voltage state and the third node N3U is high voltage state to turn on the third PMOS transistor PM3U and the third NMOS transistor. Therefore, the first PMOS transistor PM1U, the second PMOS transistor PM2U, the first NMOS transistor NM1U and the second NMOS transistor NM2U form a NOR logic gate that has two input terminals.

In a test operation mode, the test mode signal TM is in a high voltage state, so that an inversed gate clock signal GCKFB is applied to the second node N2U via the second logic gate G2U and the first logic gate G1U, and a gate clock signal GCKF is applied to the third node N3U via the fourth logic gate G4U and the third logic gate G3U. Therefore, the third PMOS transistor PM3U and the third NMOS transistor NM3U are turned on at the leading edge of the gate clock signal GCKF and the inversed gate clock signal GCKFB, and the third PMOS transistor PM3U and the third NMOS transistor NM3U are turned off at the falling edge of the gate clock signal GCKF and the inversed gate clock signal GCKFB, so that the first PMOS transistor PM1U, the second PMOS transistor PM2U, the first NMOS transistor NM1U and the second NMOS transistor NM2U form a clock control type NOR logic gate (Dynamic NOR logic gate) having two input terminals.

The input latch circuit 214 includes a fifth logic gate G5U, a sixth logic gate G6U, a fourth NMOS transistor NM4U and a fifth NMOS transistor NM5U.

The gate electrodes of the fourth NMOS transistor NM4U and the fifth NMOS transistor NM5U each receive the test mode signal TM. The source electrodes of the fourth NMOS transistor NM4U and the fifth NMOS transistor NM5U are electrically coupled to the first node N1U. An input terminal of the fifth logic gate G5U is electrically coupled with a drain electrode of the fourth NMOS transistor NM4U, and the output terminal of the fifth logic gate G5U is electrically coupled with the input terminal of the sixth logic gate G6U. The output terminal of the sixth logic gate G6U is electrically coupled with the drain electrode of the fifth NMOS logic gate NM5U. Therefore, the fourth NMOS transistor NM4U and the fifth NMOS transistor NM5U are turned on simultaneously, and a latch structure formed by the fifth logic gate G5U and the sixth logic gate G6U is electrically coupled with the first node N1U to stably latch the present logic state of the first node N1U.

The output latch circuit 216 includes a seventh logic gate G7U, an eighth logic gate G8U, a ninth logic gate G9U, a tenth logic gate G10U, an eleventh logic gate G1U, a fourth PMOS transistor PM4U, a fifth PMOS transistor PM5U, a sixth PMOS transistor PM6U, a sixth NMOS transistor NM6U, a seventh NMOS transistor NM7U, an eighth NMOS transistor NM9U and a ninth NMOS transistor NM9U.

The seventh logic gate G7U has a first input terminal electrically coupled with the first node N1U, a second input terminal receiving an output clock signal CKF and an output terminal electrically coupled with the fourth node N4U. The eighth logic gate G8U has a first input terminal electrically coupled with the first node N1U, a second input terminal receiving an inversed output clock signal CKFB and an output terminal electrically coupled with the fifth node N5U.

The fourth PMOS transistor PM4U has a source electrode receiving a first source voltage VDD, a gate electrode electrically coupled with a seventh node N7U and a drain electrode electrically coupled with a sixth node N6U. The fifth PMOS transistor PM5U has a source electrode receiving the first source voltage VDD, a gate electrode electrically coupled with a sixth node N6U and a drain electrode electrically coupled with a seventh node N7U. The sixth NMOS transistor NM6U has a source electrode receiving a second source voltage VSS, a gate electrode electrically coupled with the fourth node N4U and a drain electrode electrically coupled with the sixth node N6U. The seventh NMOS transistor NM7U has a source electrode receiving a second source voltage VSS, a gate electrode electrically coupled with the fourth node N4U through the ninth logic gate G9U and a drain electrode electrically coupled with the seventh node N7U.

The sixth PMOS transistor PM6U has a source electrode receiving the first source voltage VDD, a gate electrode electrically coupled with the seventh node N7U and a drain electrode electrically coupled with a eighth node N8U. The eighth PMOS transistor PM8U has a source electrode receiving the second source voltage VSS, a gate electrode electrically coupled with the fifth node N5U and a drain electrode electrically coupled with the eighth node N8U.

The ninth NMOS transistor NM9U has a source electrode receiving the second source voltage VSS, a gate electrode receiving a reset signal PVCHB and a drain electrode electrically coupled with the eighth node N8U.

The input terminal of the tenth logic gate G10U is electrically coupled with the eighth node N8U. The output terminal of the tenth logic gate G10U is electrically coupled with an input terminal of the eleventh logic gate G11U. The output terminal of the eleventh logic gate G11U is electrically coupled with the eighth node N8U.

Thus, the eighth node N8U is changed to be in a low voltage state, and the eighth node N8U is latched by the reset signal PVCHB when the power is turned-on, so that the pull up driving signal DPU is converted to be a low voltage state.

When the first node N1U is in a low voltage state, the fourth node N4U is changed to be in a high voltage state and the seventh node N7U is changed to be in a high voltage state to turn on the sixth NMOS transistor NM6U, so that the pull up driving signal DUP is changed to be a low voltage state.

When the first node N1U is in a high voltage state, the fifth node N5U is changed to be in a low voltage state to turn off the eighth NMOS transistor NM8U. The gate clock signal GCKF is applied to the fourth node N4U via the logic gate G7U, so that the seventh node N7U is changed to be in a low voltage state to turn on the sixth PMOS transistor PM6U, when the gate clock signal GCKF is in a high voltage state. Therefore, the eighth node N8U is changed to be in a high voltage state, and latched stably via the latch structure formed by the tenth logic gate G10U and the eleventh logic gate G11U.

Figure 4:
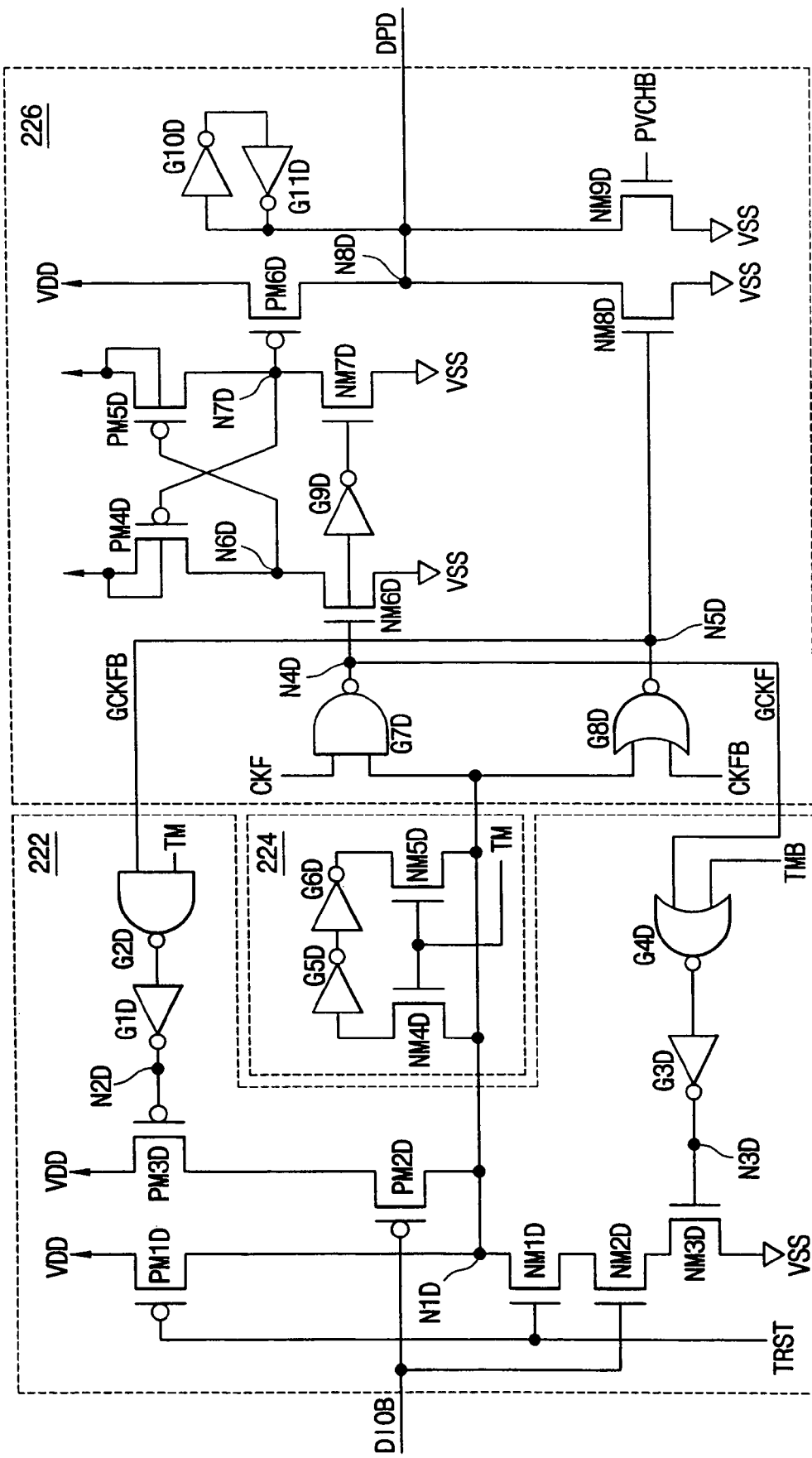
FIG. 4 is a circuit diagram showing a pull down driving part of FIG. 2.

FIG. 4 is a detailed circuit diagram showing a pull down driving part of FIG. 2.

Referring to FIG. 4, the pull down driving part 220 of FIG. 2 includes an input logic circuit 222, an input latch circuit 224 and output latch circuit 226.

The input logic circuit 222 includes a first PMOS transistor PM1D, a second PMOS transistor PM2D, a third PMOS transistor PM3D, a first NMOS transistor NM1D, a second NMOS transistor NM2D, a third NMOS transistor NM3D, a first logic gate G1D, a second logic gate G2D, a third logic gate G3D and a fourth logic gate G4D.

The input latch circuit 224 includes a fifth logic gate G6D, a sixth logic gate G6D, a fourth NMOS transistor NM4D and a fifth NMOS transistor NM5D.

The output latch circuit 226 includes a seventh logic gate G7D, an eighth logic gate G8D, a ninth logic gate G9D, a tenth logic gate G10D, an eleventh logic gate G11D, a fourth PMOS transistor PM4D, a fifth PMOS transistor PM5D, a sixth PMOS transistor PM6D, a sixth NMOS transistor NM6D, a seventh NMOS transistor NM7D, an eighth NMOS transistor NM8D and a ninth NMOS transistor NM9D.

The input latch circuit 224 and the output latch circuit 226 of the pull down driving part 220 have the same structure as the input latch circuit 214 and the output latch circuit 216 of the pull up driving part 210, respectively, as described above with reference to FIG. 3. Thus, any further explanation concerning the input latch circuit 224 and the output latch circuit 226 of the pull down driving part 220 will be omitted.

Elements of the pull down driving part are named after the corresponding elements of the pull up driving part except for 'U' and 'D'.

A drain electrode of the first NMOS transistor NM1D is electrically coupled with a first node N1D. A gate electrode of the first NMOS transistor NM1D receives an output control signal TRST. A drain of the second NMOS transistor NM2D is electrically coupled with a source electrode of the first NMOS transistor NM1D. A gate electrode of the second NMOS transistor NM2D receives a data signal DIOB. The third NMOS transistor NM3D has a drain electrode electrically coupled with a source electrode of the second NMOS transistor NM2D, a source electrode receiving the second source voltage VSS and a gate electrode electrically coupled with the third node N3D.

The PMOS transistor PM1D has a drain electrode electrically coupled with the first node N1D, a source electrode receiving a first source voltage VDD and a gate electrode receiving an output control signal TRST. A drain electrode of the second PMOS transistor PM2D is electrically coupled with the first node N1D. A gate electrode of the second PMOS transistor PM2D receives a data signal DIOB. The third PMOS transistor PM3D has a drain electrode electrically coupled with a source electrode of the second PMOS transistor PM2D, a source electrode receiving the first source voltage VDD and a gate electrode electrically coupled with the second node N2D.

The output terminal of the logic gate G1D is electrically coupled with the second node N2D. The input terminal of the first logic gate G1D is electrically coupled with an output terminal of the second logic gate G2D. A first input terminal of the second logic gate G2D is electrically coupled with a fifth node N5D. A second input terminal of the second logic gate G2D receives a test mode signal TM.

An output terminal of the third logic gate G3D is electrically coupled with the third node N3D. An input terminal of the third logic gate G3D is electrically coupled with an output terminal of the fourth logic gate G4D. A first input terminal of the fourth logic gate G4D is electrically coupled with the fourth node N4D and a second input terminal of the fourth logic gate G4D receives a inversed test mode signal TMB.

In a normal operation mode, the test mode signal TM is in a low voltage state, so that the first PMOS transistor PM1D, the second PMOS transistor PM2D, the first NMOS transistor NM1D and the second NMOS transistor NM2D form a NAND logic gate having two input terminals.

In a test operation mode, the test mode signal TM is in a high voltage state, so that the first PMOS transistor PM1D, the second PMOS transistor PM2D, the first NMOS transistor NM1D and the second NMOS transistor NM2D form a clock control type NAND logic gate (Dynamic NAND logic gate) having two input terminals.

Hereinafter, a method of measuring an access time of the DDR SDRAM of the present invention is discussed in further detail.

Figure 5:
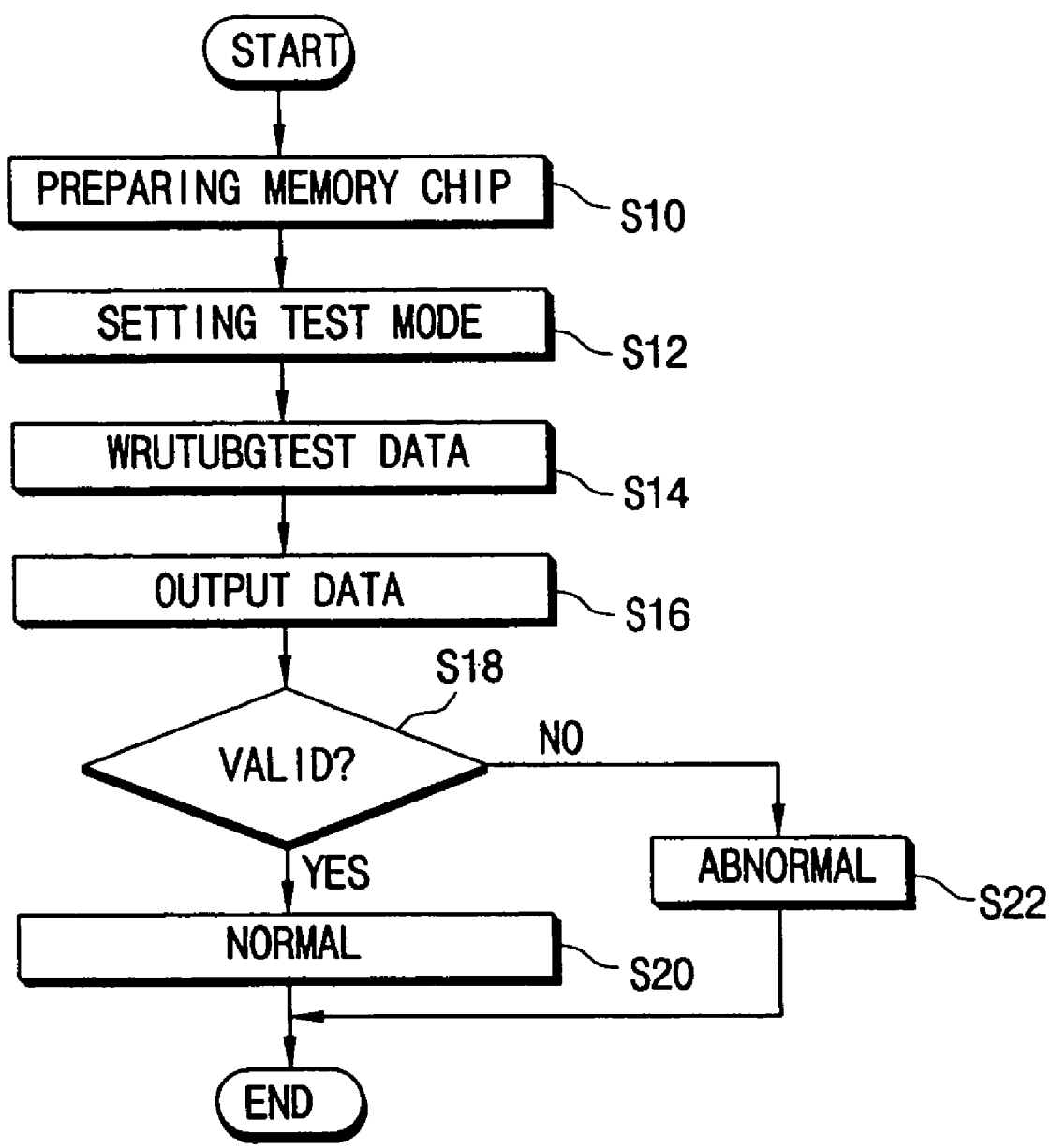
FIG. 5 is a flow chart showing a method for testing an access time of a memory chip.

FIG. 5 is a flow chart showing a method for testing the access time of a memory chip.

Referring to FIG. 5, a memory chip to be measured is disposed on a stage of a measuring apparatus (step S10).

The memory chip is set to test mode (step S12), so that the memory chip decodes the data that is reserved in the mode register to adjust the test mode signal to be in an active state, for example a high state.

Test data is next applied to the memory chip, so that the test data is reserved in the memory cell array of the memory chip (step S14).

A read command is applied to the memory chip synchronously with a clock signal (step S16), and the output data that is generated from a point of time when the read command is applied to the memory chip to a predetermined point of time (or a point of time when access time measured, refer to FIGS. 7 and 8) is compared with pre-input test data to decide whether or not the output data is valid (step S18).

The memory chip is determined as being defective when the output data is not valid (step S22), and the memory chip is determined as normal when the output data is valid (step S20).

Figure 6:
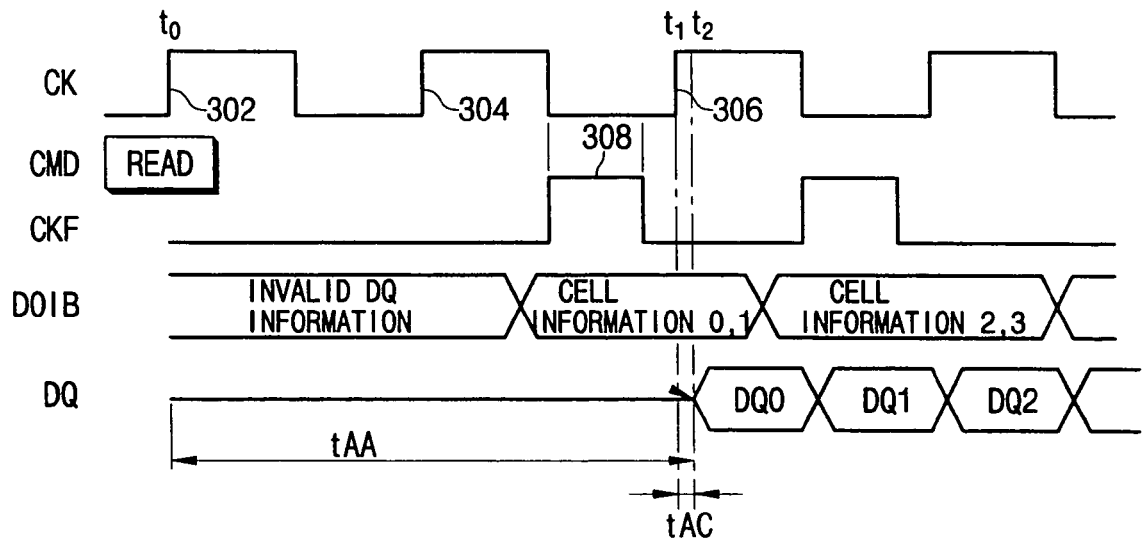
FIG. 6 is a timing chart showing access time in a normal case.

FIG. 6 is a timing chart showing access time in a normal case.

Referring to FIG. 6, in case of normal operation, when a portion of a positive pulse 308 of the output clock signal CKF is overlapped with a cell data (0, 1) properly, data DQ 0 are generated synchronously with the leading edge of the clock signal CK, whereas data DQ 1 are generated synchronously with the failing edge of the clock signal CKF.

Thus, the "access time tAA" corresponds to the time interval that has elapsed from the point of time $t_0$ of the leading edge 302 of the clock signal CK to the point of time $t_2$ when effective data are generated from the read command synchronous with the leading edge $t_0$ of the clock signal 302. The "clock access time tAC" corresponds to the time interval from the point of t1, or the leading edge $t_1$ of the clock signal 306, to the point of $t_2$.

Figure 7:
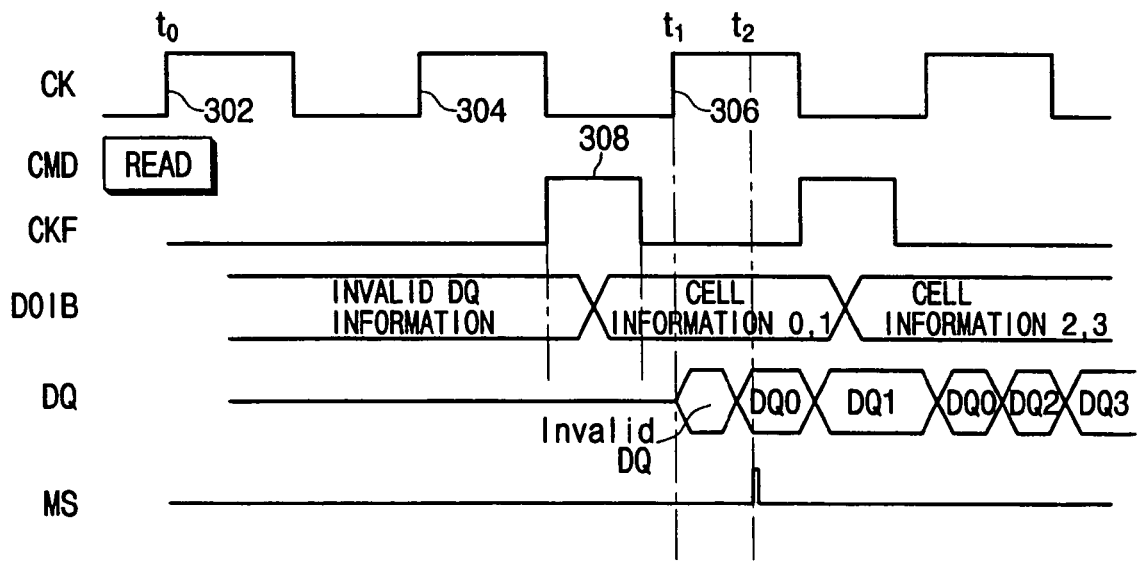
FIG. 7 is a timing chart showing test error in the access time in an abnormal case.

FIG. 7 is a timing chart showing a test error of a determination of access time in an abnormal case.

Referring to FIG. 7, in an abnormal case, a positive pulse section 308 of the output clock signal CKF does not overlap with the cell data (0,1) of the data signal DOIB, but instead overlaps with a portion of an invalid data signal DOIB. Invalid data DQ are output synchronously with the rising edge of the clock signal CKF, and then valid data DQ 0 are output in the same frame. Therefore, data DQ 0 are output. In the falling edge of the clock signal CK, data DQ 1 are output. In the next frame of the clock signal, the cell data (0,1) are input. Then, the cell data (2,3) are input. Therefore, data DQ 0 and DQ 2 are output synchronously with the leading edge of the clock signal CKF, whereas the data DQ 3 are output synchronously with the falling edge of the clock signal CKF.

As explained above, abnormal data are output. However, at the point of time $t_2$ corresponding to the point of time for measuring of an objective apparatus, the data DQ 0 are output. In this manner, a memory chip that behaves abnormally is treated as a normally operating memory chip.

That is, when a measure strobe signal MS exists between the points in time $t_1$ and $t_2$, the abnormal memory chip is properly treated as an abnormal memory chip; however, when the measure strobe signal MS exists following the $t_2$ time period, the abnormal memory chip is treated as a normal memory chip.

In a real test case, an error in measurement can occur, for example, due to limitations of the measuring apparatus, measurement noise, and due to an inexperienced operator of the measuring apparatus.

In the case where the input logic circuit of the output buffer is neither dynamic NAND-type nor dynamic NOR-type, when the input data is changed, the changed input data are transferred to the output latch circuit to be output.

Figure 8:
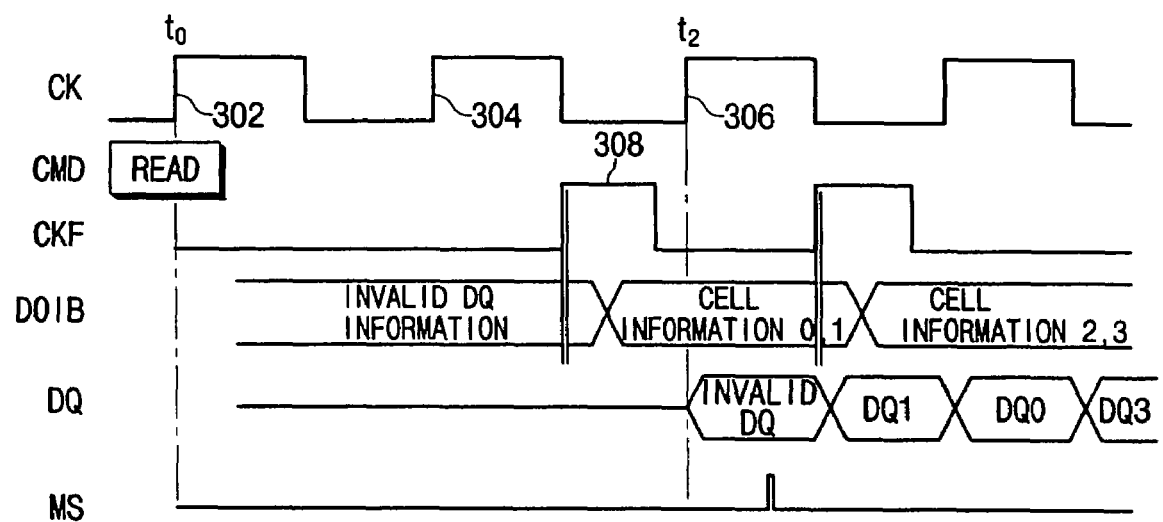
FIG. 8 is a timing chart showing a test process of the access time in an abnormal case.

FIG. 8 is a timing chart showing the signals associated with a test process for measuring access time in the abnormal case, in accordance with the present invention.

Referring to FIG. 8, when measuring while in a test mode in accordance with the present invention, the input logic circuit of an output buffer is operated as a dynamic NAND-type and dynamic NOR-type buffer, so that data are input only at a leading edge due to an input latch circuit, and an input latch circuit latches the data to output. Thus, latched invalid data are output at the leading edge of the clock signal CKF, and data DQ 1 are output at the falling edge of the clock signal CKF. In this manner, an invalid reading of the output data is avoided.

Figure 9:
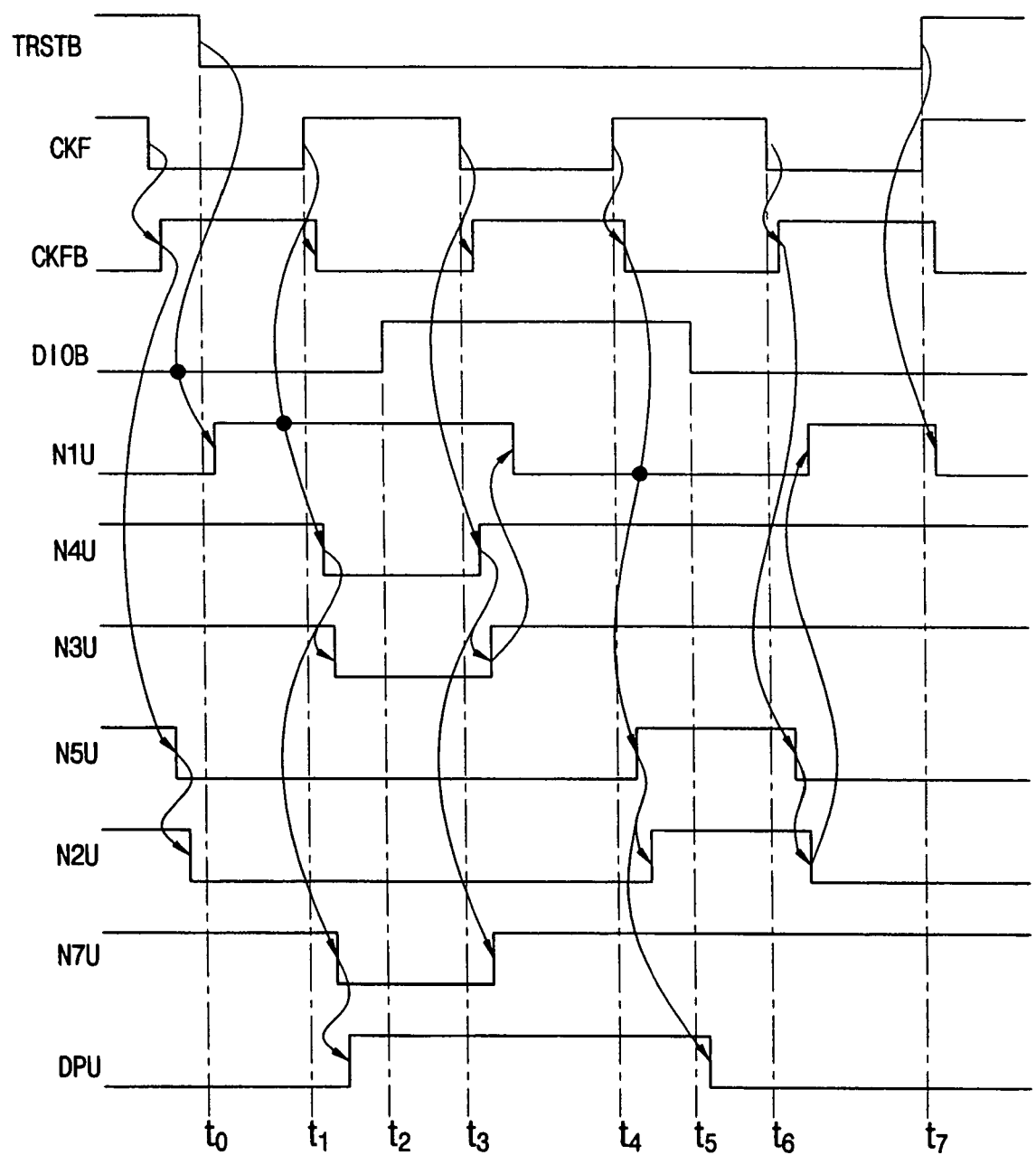
FIG. 9 and FIG. 10 are timing charts showing the timing of various components of an output buffer according to embodiments of the present invention.
Figure 10:
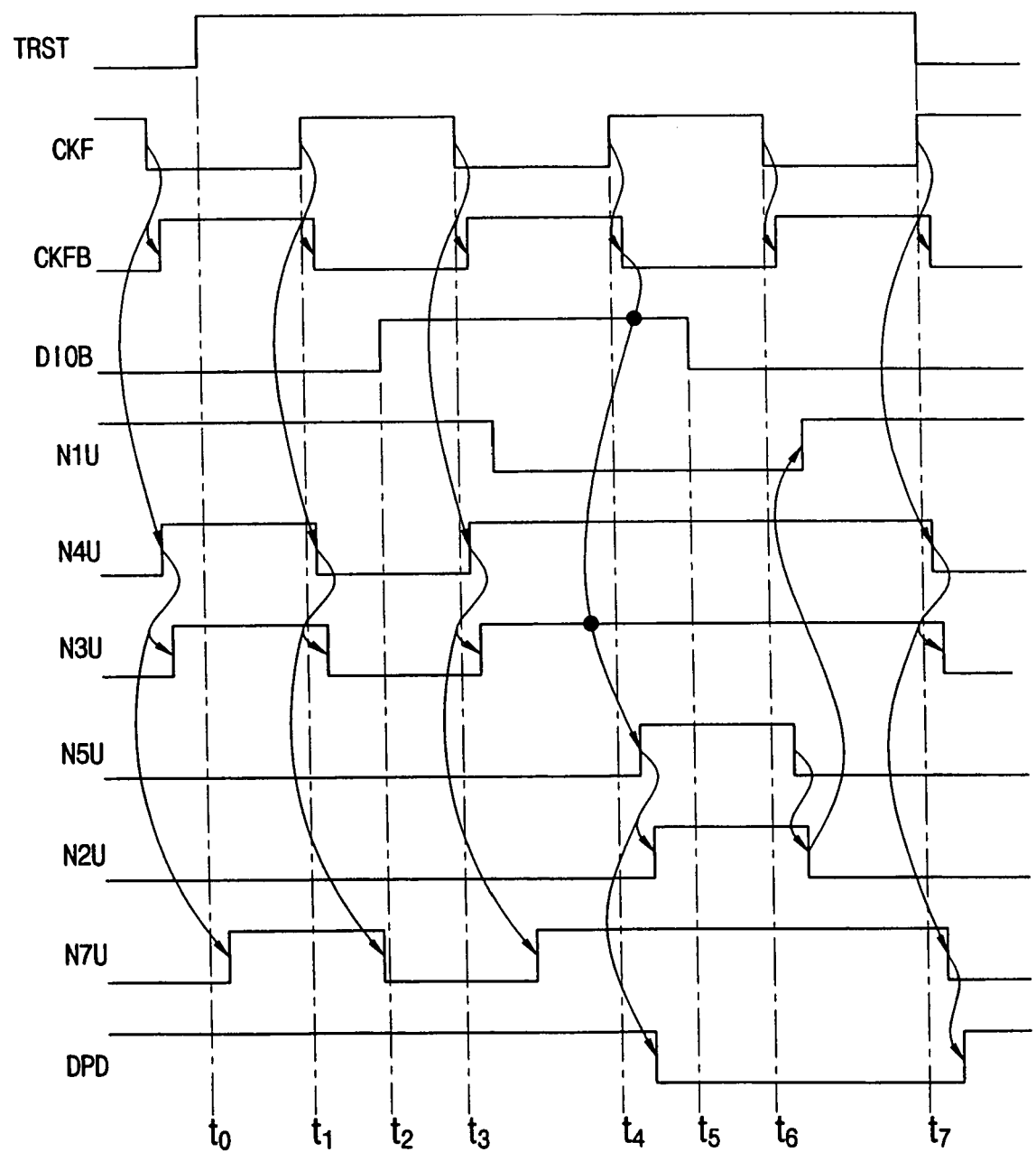

FIG. 9 and FIG. 10 are detailed timing charts showing the timing at various nodes and parts of the output buffer of the present invention.

Referring to FIGS. 9 and 10, when the pull up driving part 210 is in an output disabled state, the first node N1U maintains low voltage state regardless of the data signal DOIB because the first NMOS transistor NM1U is turned on due to a high voltage state of the inversed output control signal TRSTB. Therefore, the fourth node N4U is maintained in a high voltage state, and the fifth node N5U is changed to be in an inversed state of the inversed output clock signal CKFB. When the fourth node N4U is maintained in a high voltage state, the seventh node N7U is changed to be in the high voltage state, so that the sixth PMOS transistor PM6U is turned off and the eighth NMOS transistor NM8U toggles between a turned on state and a turned off state according to the inversed output clock signal CKFB. Therefore, the pull up driving signal DPU is maintained in a low voltage state.

When pull down driving part 220 is in the output disabled state, the first PMOS transistor PM1D is maintained in the high voltage state, when the output control signal TRST is in the low voltage state. Therefore, the first node N1D is maintained in the high voltage state regardless of the state of data signal DIOB, so that the fifth node N5D is maintained in the low voltage state and the fourth node N4D is maintained in an inversed state of the output clock signal CKF. The eighth NMOS transistor NM8D is turned off, because the fifth node N5D is in the low voltage state. Therefore, the seventh node N7D toggles between the turned on state and the turned off state, so that the pull down driving signal DPD is maintained in the high voltage state.

When the inversed control output signal TRSTB is changed to be in the low voltage state at the time $t_0$, the first node N1U of the pull up driving part 210 is changed to be the high voltage state at a time when a second PMOS transistor PM2U is turned on. When the second PMOS transistor PM2U is turned on, a first PMOS transistor PM1U and a third PMOS transistor PM3U have been already turned on. Thus, the fifth node N5U stops toggling and remains in the low voltage state, and an output clock signal CKF is output while the fourth node N4U is in the high voltage state. The first node N1D of pull down driving part 220 remains in the high voltage state even when an inversed output control signal TRST is changed to the high voltage state.

At the time t1, the fourth node N4U of the pull up driving part 210 is changed in the low voltage state in response to a rising edge of the output clock signal CKF. Thus, while the eighth NMOS transistor NM8U is turned off, the seventh node N7U is changed to the low voltage state, so that the pull up driving signal DPU is changed from the low voltage state to the high voltage state. Thus, the pull up module MPU is turned on, so that the output terminal DQ corresponding to the high voltage state is output. The fourth node N4D of the pull down driving part 220 is changed to be the low voltage state at a leading edge of CKF. While the eighth NMOS transistor NM8U remains in a turned off state, the seventh node N7D is changed to the low voltage state, so that the pull down driving signal DPD is maintained to the high voltage state. Thus, pull down device MPD remains in a turned off state.

The first node N1U remains in the high voltage state, even when data signal DIOB changes from the low voltage state to the high voltage state as long as the output signal CKF remains in the high voltage state. That is, when the output signal CKF is in the high voltage state, the output terminal DQ does not change regardless of a state of the data signal DIOB. In pull down driving part 220, the first node N1D is in the high voltage state, even when data signal DIOB changes to the high state, because the third node N3D maintains in the low state in response to the output signal CKF.

When the output signal CKF changes from the high voltage state to the low voltage state at $t_3$, the fourth node N4U and the third node N3U change to the high voltage state. Thus, the first node N1U changes to the low voltage state. In pull down driving part, the first node N1D changes to the low voltage state, because the fourth node N4D and the third node N3D change to the high voltage state. The first node N1D remains in the low voltage state in response to the high voltage state of the inversed output signal CKFB, even when the first node N1D changes to the low voltage state.

At a time $t_4$, the fifth node N5U of the pull up driving part 210 remains in the low voltage state in response to the high voltage state of the inversed output signal CKFB. When the inversed output signal CKFB changes to the low voltage state, the fifth node N5U changes to the high voltage state. The fifth node N5D of the pull down driving part 220 changes to the high voltage state in response to a change of state of the inversed output clock signal CKFB. Thus, the eighth node NM8D is turned on, so that the pull up driving signal DPD becomes the low voltage state to output DQ that is in the low voltage state.

At a time $t_5$, the first node N1D remains in the low state even when the data signal DIOB changes from the high voltage state to the low voltage state because both the fifth node N5D and the second node N2D are in the high voltage state.

At a time $t_6$, in the pull up driving part 210, the fifth node N5U and the second node N2U change to the low voltage state in response to leading edge of the inversed output clock signal CKFB. Thus, the first node N1U is changed to be in the high voltage state. In the pull down driving part 220, the fifth node N5D and the second node N2D change to the low state, so that the first node N1D changes to the high state.

At a time $t_7$, the output signal DQ output remains in a high impedance state under the output disabled state.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A synchronous memory device comprising:
  a memory cell array that stores data;
  a read output circuit that reads the data stored in the memory cell array, and outputs a data signal; and
  an output buffer maintaining an output terminal in a high impedance state in a stand by mode, the output buffer latching the data signal in response to a level of an output clock signal so that the data signal is output from the output terminal in response to the latched data signal in a first operation mode, the output buffer latching the data signal in response to an edge of the output clock signal so that the data signal is output from the output terminal in response to the latched data signal in a second operation mode, wherein the first operation mode corresponds to a normal operation mode, and the second operation mode corresponds to a test operation mode.

2. The synchronous memory device of claim 1, wherein the output buffer latches the data signal in response to a leading edge of the output clock signal, in the second operation mode.

3. The synchronous memory device of claim 1, wherein the output buffer comprises:
  a pull up module for pulling up the output terminal to a first source voltage when the pull up module is active;
  a pull down module for pulling down the output terminal to a second source voltage lower than the first source voltage when the pull down module is active;
  a pull up driving part maintaining the pull up module in an inactive state in a stand by mode, the pull up driving part latching a data signal in response to a state of an output clock signal in a first operation mode, the pull up driving part latching the data signal in response to an edge of the output clock signal in a second operation mode, the pull up driving part driving the pull up module in response to the latched data signal in each of the first and second operation modes; and
  a pull down driving part maintaining the pull down module in the inactive state in stand by mode, the pull down driving part latching the data signal in response to a state of the output clock signal in the first operation mode, the pull down driving part latching the data signal in response to the edge of the output clock signal in the second operating mode, the pull down driving part driving the pull down module in response to the latched data signal in each of the first and second operation modes.

4. The synchronous memory device of claim 3, wherein the pull up driving part and the pull down driving part each latch the data signal in response to a leading edge of the output clock signal, in the second operation mode.

* * * * *